United States Patent [19]

Dick et al.

[11] Patent Number: 5,039,939
[45] Date of Patent: Aug. 13, 1991

[54] CALCULATING AC CHIP PERFORMANCE USING THE LSSD SCAN PATH

[75] Inventors: Carroll J. Dick, Dryden; Bruce J. Ditmyer, Endwell; Thomas L. Jeremiah, Endicott; Lawrence Jones; Gregory S. Still, both of Endwell, all of N.Y.

[73] Assignee: International Business Machines Corporation, Armonk, N.Y.

[21] Appl. No.: 291,919

[22] Filed: Dec. 29, 1988

[51] Int. Cl.[5] ............................................. G01R 31/00
[52] U.S. Cl. ................................ 324/158 R; 324/617; 371/22.3
[58] Field of Search .......... 324/57 DE, 73 AT, 73 R, 324/158 T, 158 R, 73.1; 371/22.3, 62

[56] References Cited

U.S. PATENT DOCUMENTS

| | | |
|---|---|---|
| 3,784,907 | 1/1974 | Eichelberger ........................ 371/62 |
| 4,051,352 | 9/1977 | Eichelberger et al. ............. 364/716 |
| 4,063,080 | 12/1977 | Eichelberger et al. ............. 235/302 |
| 4,293,919 | 10/1981 | Dasgupta et al. .................... 364/716 |
| 4,476,431 | 10/1984 | Blum ...................................... 324/73 |
| 4,477,902 | 10/1984 | Puri et al. ............................. 371/25 |
| 4,513,418 | 4/1985 | Bardell, Jr. et al. .................. 371/25 |
| 4,564,943 | 1/1986 | Collins et al. .......................... 371/28 |
| 4,602,210 | 7/1986 | Fasang et al. ........................ 324/73 |
| 4,641,306 | 2/1987 | Annecke et al. ...................... 371/25 |

FOREIGN PATENT DOCUMENTS 0130610 1/1985 European Pat. Off. .
0099540 8/1979 Japan ................................. 371/62

OTHER PUBLICATIONS

Beacom et al., "Logic Delay Characterization of a LSSD Logic Circuit Using a Scan Ring", IBM TDB vol. 27, No. 11, Apr. 1985.
J. C. Leininger, "Method of Delay Testing for VLSI Chips, Modules or Cards that are Designed Using LSSD Design Rules," IBM TDB, vol. 27, No. 4B, Sep. 1984.

Primary Examiner—Kenneth A. Wieder
Assistant Examiner—William J. Burns
Attorney, Agent, or Firm—John C. Smith

[57] ABSTRACT

Chip performance is measured using LSSD logic to propagate a signal through the LSSD scan path of the chip. The measurement data is compared to tabular data which is used to classify the AC chip performance. The use of the LSSD scan path provides an accurate overall measurement of an entire chip. The circuitry is internal to the system and does not require external test circuitry. No unique test patterns are required for a given chip design. The chip measurements can be made after installation of the chip in a field operational environment as well as during a manufacturing and testing environment. The chip measurements can be made by local execution of the testing or controlled from a remote location.

9 Claims, 1 Drawing Sheet

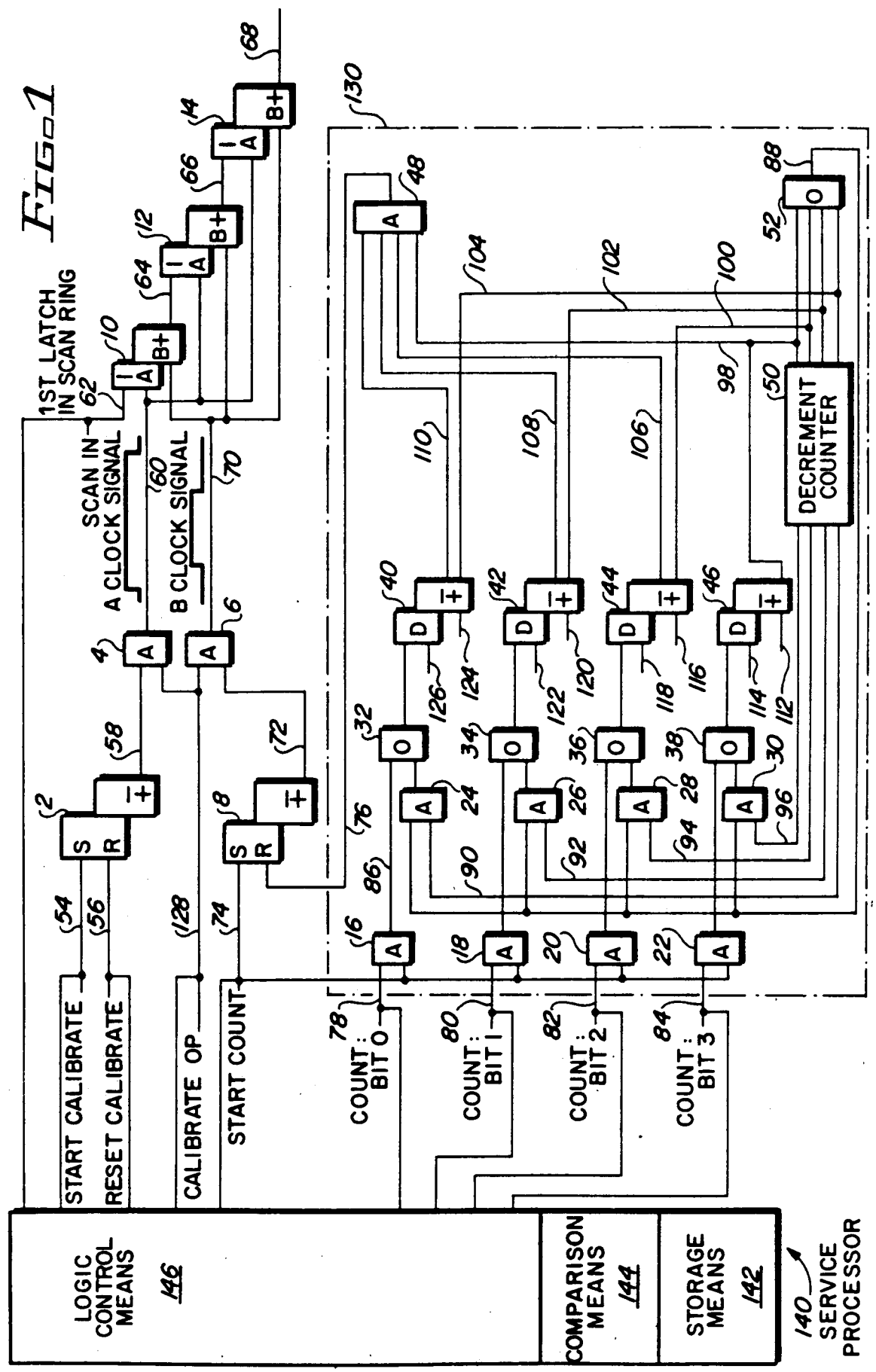

CALCULATING AC CHIP PERFORMANCE USING THE LSSD SCAN PATH

BACKGROUND OF THE INVENTION

1. Technical Field

The present invention relates to chip performance measurement, and in particular to the use of LSSD scan path circuit delay data in comparison with a predetermined value to evaluate overall AC chip performance.

2. Background Art

The continuing increase in complexity and speed of electronic circuitry has posed numerous problems in measurement or testing of circuits to ensure that they meet minimum performance criteria. In particular, the development and use of integrated circuits of ever increasing size and complexity has posed numerous problems in the area of AC performance testing in a field operational environment. The difficulties involved in AC performance testing present additional problems in an field operational environment due to the complexity of tests, the expensive and inconvenient nature of the test equipment, and the possibility of not detecting AC defective circuits with known techniques. For purposes of this patent application, AC performance testing refers to dynamic time dependent testing, as opposed to DC stuck fault testing which is non-time dependent testing forpurposes of error isolation.

Typically, AC performance testing is performed during manufacture and test of circuitry using external test equipment. One reason why testing is not done when the circuitry is installed in a field operational environment is that the external test equipment used for AC performance testing is both expensive and inconvenient.

It is known to use the LSSD scan path to characterize LSSD logic delay. In that method, a measurement is used wherein the clocks are turned on, and a signal is flushed entirely through the scan path. For purposes of this disclosure, flushing is defined as holding the clock inputs to an LSSD latch to an active level, thereby allowing a value placed on the input to the first latch in the scan path to scan through the scan path at the switching speed of the latches. This technique allows a single pass/fail result to be achieved for a test based on a given clock speed. However, this technique is not feasible for many situations, because the scan input or output is not accessible to probing by external test equipment for measurement due to packaging considerations.

It is also known to do performance testing through the use of complicated test patterns which exercise the functional logic unique to each chip. When using complicated test patterns, the path lengths are typically short compared to the LSSD scan path. This results in measurements which require very precise test equipment for accuracy which causes high cost to obtain the measurement data. Further, such prior attempts at testing have only been able to test on a pass/fail basis for a given clock speed.

Another prior art approach at pass/fail testing is to use clock shifting to allow testing with less expensive testers. However, the same problems of inability to detect marginal circuits due to the pass/fail nature of the test, and the expense and inconvenience of using external testers in the field apply to this method, just as they did to the methods discussed previously.

In summary of the problems associated with the prior art, typically, AC performance measurement is performed in a manufacturing or test environment and not in a field operational environment. A factor that limits the use of AC chip performance measurements in the field is that the measurements generally require precise and expensive external test equipment. Transporting such equipment around in the field is a highly undesirable practice. After circuits leave the manufacturing and test environment, AC defective circuits are difficult to detect in the field operational environment.

Further, AC chip performance testing often requires detailed knowledge of the underlying chip design in order to generate elaborate test data patterns to exercise the functional logic of each chip design to obtain a measurement. Test data patterns are expensive to generate because they must be individually created for each particular circuit design. In addition, AC performance testing is done on a pass/fail basis for a given clock speed.

SUMMARY OF THE INVENTION

It is an object of this invention to improve testing and calibration of AC chip performance.

It is another object of this invention to categorize AC chip performance with a single scan of the LSSD scan path.

It is a further object of this invention to test AC chip performance without requiring test circuitry external to the system.

It is yet another object of this invention to test chips without generating detailed test pattern data for each chip design.

It is yet a further object of this invention to detect AC defective chips after installation of the chip in an operational environment which were not detected in a manufacturing and testing environment.

These an other objects are accomplished by a system using the LSSD circuitry on a chip to obtain AC performance measurements by propagating a signal through the LSSD scan path which is usually the longest path on the chip. Logic means control propagation of the signal through the LSSD scan path for a predetermined period of time. The distance through the LSSD scan path which the signal has been propagated is a function of the AC performance characteristics of the chip. After propagation is halted by the logic means, the LSSD scan path is analyzed to determine how far the signal has propagated through the scan path. A value indicative of the distance the signal was propagated through the scan path is used as AC timing measurement data. Comparison means then compares the AC timing measurement data with predetermined AC classification data which is stored in the system to determine the overall classification of the chip as one of a plurality of possible chip performance classes.

BRIEF DESCRIPTION OF THE DRAWINGS

FIG. 1 is a schematic representation of the calibration logic used in the invention for testing AC performance.

DESCRIPTION OF THE PREFERRED EMBODIMENT

Prior to discussing the detailed description of the invention, the following is a broad overview of the invention.

The invention disclosed herein, makes use of the LSSD scan path, which is commonly used in prior art testing schemes for DC stuck fault testing, to generate AC chip performance measurements. Further, the very LSSD latches, whose AC performance is to be measured, form a part of the apparatus used for the measurement. The measurement begins by placing the LSSD chip in scan mode, which arranges the latches on the chip into a scan path having a serial configuration. In scan mode, the latches are controlled by three signals. Two of the signals are clocks, both of which must be at an active level to propagate a signal. The third signal is the value which is to be propagated. The scan path is first flushed by holding both clocks in an active state and placing a uniform value on the third line. Since the clocks are held active, the signal will be flushed through the scan path at the switching speed of the circuitry. The clock signals are ideally held active for a period which is long enough to flush the entire scan path. After the scan path is flushed, one of the clock lines is placed in an inactive state. It does not matter which clock line is deactivated to accomplish the purpose of the invention since the LSSD scan path requires both clock lines to be up in order to propagate a signal through the scan path, the deactivation of either clock line terminates the flush operation.

After the flush operation is complete, the measurement operation begins. The uniform value on the third line is inverted. Then, a predetermined time value is placed in clock control means which control the amount of time that will be allocated for the propagation of the third signal value. The predetermined time value can be generated in any number of ways, including software programming or hardware implementation. The preferred embodiment uses clock control means which are treated herein as part of the logic control means. The clock control means are a binary decrementing counter 130 which is well known in the art. The deactivated clock signal is activated and the value on the third signal line begins to flush through the scan path. When the time limit defined by the predetermined time value is reached, the clock control means halts the propagation of the uniform value through the scan path. At this point, the distance the value has propagated through the scan path, which is a function of AC chip performance, can be determined. After the distance the propagated value has traveled through the scan path is determined, it is compared to a table of predetermined values that represent categories of AC chip performance for that particular chip design. The AC chip performance is categorized according to the results of the comparison.

Now, with regard to the detailed preferred embodiment, as shown in FIG. 1, the logic control means 146, the comparison means 144, and the storage means 142 are all shown as part of the service processor 140. This is optional as each of the foregoing components could be located elsewhere in the system in the form of hardware embodiments. In addition, the comparison means 144, and the portions of the logic control means 146 could be implemented in software. For ease of illustration, portions of the logic control means 146, including the clock control means which is a binary decrementing counter 130, and some additional control latches 2, 4, 6, are shown separately from the remainder of the logic control means 146 in FIG. 1. The signals that drive the AC performance measurement operation, including the predetermined time value are generated by the logic control means 146.

To explain the operation, AC performance testing using LSSD scan path measurement is accomplished by first turning off the system clock. Once the clock has been turned off, the service processor 140 then initializes scan mode which involves configuring the LSSD latches in the LSSD circuit into a serial chain called the LSSD scan path. Scan mode is well known in the art of LSSD circuitry.

The logic control means produce AC timing measurement data by controlling the execution of the AC performance measurement. The logic control means 146 begins AC measurement by flushing a value on Scan In line 62 through the LSSD scan path 10, 12, 14 for the purpose of setting all latches to a uniform value. A flushing operation does not rely on clock pulses, but instead propagates a signal through the LSSD scan path 10, 12, 14 at a rate determined solely by circuit delay.

The flush operation is controlled by the A clock signal on line 60 and the B clock signal on line 70, which are controlled by the logic control means 146. The A clock signal on line 60 and the B clock signal on line 70 are controlled by the logic control means 146 including latches 2, 4, 6, and counter 130. The value to be flushed is generated by the logic control means 146 and is placed on the Scan In line 62. The particular value selected for placement on the Scan In line 62 is irrelevant. It is only important that the value does not change during the flush operation, and that the value flushed through the LSSD scan path 10, 12, 14 in the measurement step is an different from the value used in the flush step so that its propagation termination point can be found.

After the flushing operation has begun a binary decrementing counter 130 is provided to create a delay which determines the duration of the flush operation. A predetermined time value is selected by the logic control means 146 and placed on lines 78, 80, 82, 84 which allows enough time to flush the entire LSSD scan path 10, 12, 14.

After the flush operation has been completed, the B clock is turned off when counter 130 decrements to one, thereby stopping propagation in the LSSD scan path 10, 12, 14. Then the value on the Scan In line 62 is changed by the logic control means 146. The value is changed from the previous value propagated through the LSSD scan path 10, 12, 14 so that when it is propagated partially through the LSSD scan path 10, 12, 14, its termination point can be detected. A B clock pulse of predetermined width is generated which propagates the changed value of the Scan In signal on line 62 through the LSSD scan path 10, 12, 14. The pulse width is selected such that the Scan In value on line 62 does not propagate through the entire LSSD scan path 10, 12, 14.

The pulse width is selected by the logic control means 146 according to the number of LSSD latches on the chip. The shorter the scan path on the chip, the narrower the pulse width. Correspondingly, the longer the scan path, the wider the pulse width. While a narrow pulse width selected for a short scan path would work on longer scan paths, selecting wider pulse widths allows more accurate measurements to be made. Use of the counter 130 allows the logic control means 146 to program the pulse width for the LSSD scan path 10, 12, 14. In turn, this allows a single counter 130 to be used for multiple LSSD circuits having a wide range of possible scan path lengths. The selection of the appropriate pulse width can be implemented in a number of ways, including hardware implementation or through software programming control.

When the B clock pulse is activated by the logic control means 146, the new value on the Scan In signal on line 62, which was set after the flushing operation was complete, begins to flush though the LSSD scan path 10, 12, 14. When the B clock pulse on line 70 is terminated, it stops the flush operation. At that time, the scan in data has propagated partially through the LSSD scan path 10, 12, 14. Known LSSD techniques can then be used to determine how far the Scan In signal has propagated by serially shifting the data in the scan path. The value which defines the distance that the Scan In signal on line 62 had propagated through the LSSD scan path 10, 12, 14 is used as the AC timing measurement data.

Comparison means 144 are used to compare the AC timing measurement data with the predetermined AC performance classification data held in storage means 142 which represents a plurality of possible AC chip performance categories. The AC performance classification data only needs to be created once when the chip is designed and does not have to be recreated thereafter. Typically, as many as ten or more categories might be used. However, for purposes of illustration, it will be assumed that three categories, representing fast, nominal, and slow chips are used.

OPERATION

Referring to FIG. 1, once the LSSD scan path 10, 12, 14 has been placed in scan mode, the logic control means 146 flushes the LSSD scan path 10, 12, 14 under control of the three control lines, 60, 62, 70. The placement of an LSSD circuit in scan mode is well known in the art. The logical state which is to be flushed through the LSSD scan path is placed on Scan In line 62. Then, the control lines 60, 70 are placed in an active state as follows: the logic control means 146 activate the Start Calibrate signal 54 and the Calibrate Op signal 128, they in turn activate gate 4 which which activates the A clock signal on line 60. Because the Reset Calibrate signal on line 56 is not active at this time, the Start Calibrate signal turns on latch 2 which provides the other input to gate 4. The A clock control signal 60 is controlled by activating AND gate 4.

The B clock is activated when the logic control means 146 activates the Start Count signal on line 74 and places a predetermined time value on lines 78, 80, 82, 84 which starts the counter 130. Latch 8, which is initially in the inactive state, is turned on by the Start Count signal on line 74, which is activated for one cycle by the service processor 140. The Start Count signal also gates count bits 0-3 on lines 78, 80, 82, 84 which are initialized by the logic control means 146 to contain a value indicating the duration of time to flush the LSSD scan path 10, 12, 14. The counter gate 48 and the Start Count signal on line 74 activate latch 8 which was initially in the inactive state, which in combination with the active Calibrate Op signal on line 128 activates gate 6 turning on the B clock on line 70. The three control lines 60, 62, 70 are held in the selected states for a duration long enough to allow propagation of the Scan In signal 62 through the LSSD scan path 10, 12, 14.

The predetermined time value selected by the logic control means 146 is placed in gates 16, 18, 20, 22 of the counter 130 and decremented under control of clock pulses on lines 112, 114, 116, 118, 120, 122, 124, 126. How to generate the clock pulses on lines 112, 114, 116, 118, 120, 122, 124, 126 is well known and can be provided by the system oscillator among other sources.

The counter itself is a conventional 4-bit decrementing binary counter which is known in the art. When the value in the counter is equal to one, the circuit 48 is activated, which resets latch 8. Latch 8, in turn, resets the B clock signal on line 70 which terminates propagation through the LSSD scan path 10, 12, 14. Then, when the counter 130 decrements to zero, circuit 52 disables the counter 130 and freezes the value at zero thus resetting the signal on control line 76 to allow the next count operation to be executed.

At this point, the LSSD scan path 10, 12, 14 has been flushed and AC performance scan path measurement is about to begin. The A clock signal on line 60 is still active at this time and the B clock signal on line 70 is inactive. Next, the Scan In signal on line 62 is set to the opposite value by the logic control means 146. The Calibrate Op signal on line 128 is still active at this time. The predetermined time value which indicates the duration of the scan will be selected by the logic control means 146 and placed on lines 78, 80, 82, 84. AC measurement is begun by the logic control means 146 when the Start Count signal on line 74 is activated for one cycle. Simultaneously, the Start Count signal on line 74 activates latch 8 which enables gate 6. Gate 6 activates the B clock signal on line 70 which begins a flush operation through the LSSD scan path 10, 12, 14. The LSSD scan path 10, 12, 14 continues the flush operation until it is reset by the counter 130 which resets latch 8 in the same manner as was done when the LSSD scan path 10, 12, 14 was initialized. When the B clock on line 70 is deactivated by the counter 130, the Scan In signal on line 62 stops propagating through the LSSD scan path 10, 12, 14. Next, the logic control means 146 activates the Reset Calibrate signal on line 56 which turns off the A clock on line 60.

For the purpose of describing the preferred embodiment, the AC performance classification data used to compare with the AC timing measurement data to categorize the AC chip performance is in storage means 142 within the service processor 140. However, it can be stored at any conveniently accessible place, which can be in the service processor 140, a system storage device, or even at a remote location. Further, the comparison means 144 do not have to be located in the service processor. It can also be located wherever it is convenient. For example, a remote processor could be used by service personnel to evaluate the AC chip performance at a distance, thereby providing highly skilled technical personnel access to the system without requiring their presence on site.

The invention has many advantages including the ability to categorize AC chip performance data in a single pass, the ability to execute without external test equipment, and the ability to measure AC chip performance in field operational environments as well as in manufacturing and test environments.

While the invention has been described with respect to a preferred embodiment thereof, it will be understood by those skilled in the art that various changes in detail may be made therein without departing from the spirit, scope, and teaching of the invention. For example, the storage means 142, comparison means 144, and logic control means 146, shown as part of the service processor 140 could be implemented separate from the service processor 140 in a variety of ways, such as on disk, bubble memory, or even at a remote location. Additionally, other features such as the comparison can be made locally or remotely. Details of the circuit can also vary. For example, the A clock can be used to control the pulse width instead of the B clock. Also, the Scan In control line 62 can be activated at any point during the flush operation. Also, the programmable clock control logic could be implemented in software. Accordingly, the invention herein disclosed is to be limited only as specified in the following claims.

We claim:

1. Apparatus for testing AC performance levels in LSSD integrated circuit chips, said apparatus integrated into the LSSD integrated circuit chip under test, said apparatus comprising:

an LSSD integrated circuit to be tested and having an LSSD scan path and clock lines;

scan path flush means for setting each latch in said LSSD scan path to a uniform value;

counter means for counting a predetermined time period;

clock control means, coupled to said counter means, for activating and deactivating said clock lines in conformance with said counter means to generate AC timing measurement data within said LSSD scan path, said AC timing measurement data defining a propagation distance to which a scanning signal has propagated through said LSSD scan path; and scanning means for removing said AC timing measurement data from said LSSD scan path.

2. Apparatus as in claim 1, further comprising:

storage means for storing AC chip performance classification data; and comparison means for comparing said AC timing measurement data with said AC performance classification data, wherein said integrated circuit is classified according to overall AC circuit performance.

3. Apparatus for testing AC performance levels in LSSD integrated circuit chips, said apparatus comprising;

an LSSD integrated circuit to be tested and having an LSSD scan path;

logic control means for producing AC timing measurement data by propagating a signal through said LSSD scan path for a predetermined period of time and then scanning said LSSD scan path to measure the distance said signal has propagated;

storage means for storing AC chip performance classification data;

comparison means for comparing said AC timing measurement data with said AC performance classification data, wherein said integrated circuit is classified according to overall AC circuit performance.

4. Apparatus as in claim 3, wherein said logic control means further comprises clock control means to produce clock signals of predetermined duration for controlling the amount of time allowed for AC testing.

5. Apparatus as in claim 4, wherein said logic control means further includes means for programming the duration of said clock signals.

6. A method for testing AC performance levels in LSSD integrated circuit chips, said method comprising:

placing an LSSD integrated circuit having a plurality of latches in scan mode, wherein each of said latches is placed serially in a scan path;

setting each latch in the scan path to a first uniform value;

propagating a second uniform value through said scan path for a predetermined period of time;

measuring the number of latches in said scan path through which said second uniform signal propagated to obtain a measured value;

comparing said measured value with predetermined AC performance classification data;

categorizing the AC chip performance of the LSSD circuit based on the comparison of the measured value 7. A method, as in claim 6, further including programmably selecting the duration of said predetermined period of time.

8. In an electronic system having at least one LSSD integrated circuit with an LSSD scan path, a built-in apparatus for testing the AC performance of said at least one LSSD integrated circuit, comprising:

a clock line coupled to said at least one LSSD integrated circuit;

scan path flush means for setting each latch in said LSSD scan path to a uniform value;

a counter having stored therein a value corresponding to a predetermined length of time said counter will enable a second uniform value to propagate through said LSSD scan path;

a clock control circuit having an input coupled to said programmable counter and an output coupled to said clock line, said clock control circuit operating in response to said programmable counter to enable said second uniform value to propagate through said LSSD scan path for said predetermined length of time; and scanning means for determining the number of latches in said LSSD scan path through which said second uniform value propagated.

9. An electronic system as recited in claim 8, further comprising:

storage means for storing AC chip performance classification data;

comparison means for comparing said determined number of latches with said AC performance classification data.

* * * * *